United States Patent

Wallingford

[15] 3,641,369

[45] Feb. 8, 1972

[54] SEMICONDUCTOR SIGNAL GENERATING CIRCUITS

[72] Inventor: Clarence Robert Wallingford, Chicago, Ill.

[73] Assignee: Hazeltine Research, Inc.

[22] Filed: July 23, 1970

[21] Appl. No.: 57,738

Related U.S. Application Data

[62] Division of Ser. No. 714,663, Mar. 20, 1968, Pat. No. 3,588,544.

[52] U.S. Cl. ..............................307/260, 307/280, 307/293, 307/300, 331/108

[51] Int. Cl. ..............................H03k 5/00, H03b 5/12

[58] Field of Search ..................307/221, 223, 280, 260, 293, 307/300; 328/56; 331/107, 108, 111, 113, 57

[56] References Cited

UNITED STATES PATENTS

| | | | |
|---|---|---|---|
| 3,428,913 | 2/1969 | Pechoucek | 307/223 X |
| 3,050,640 | 8/1962 | Dillingham | 307/280 X |
| 3,418,498 | 12/1968 | Farley | 328/56 X |
| 3,299,290 | 1/1967 | Moll | 307/300 |
| 3,395,362 | 7/1968 | Sutherland | 307/223 X |
| 3,553,484 | 1/1971 | Gassmann | 307/293 X |

*Primary Examiner*—Stanley D. Miller, Jr.
*Attorney*—Edward A. Onders

[57] ABSTRACT

Disclosed are semiconductor circuits which are capable of operating as oscillators or as combined oscillators and triggered pulse generators, and which make use of internal transistor capacitance in such a manner that external discrete capacitors are not required to provide such operation.

6 Claims, 3 Drawing Figures

SEMICONDUCTOR SIGNAL GENERATING CIRCUITS

This is a division of application, Ser. No. 714,663, filed Mar. 29, 1968, now Pat. No. 3,588,544.

SUMMARY OF THE INVENTION

This invention relates to semiconductor circuits, and more particularly, to new circuits which utilize the charging and discharging of an internal semiconductor capacitance to generate desired signals.

Many semiconductor circuits such as oscillators, multivibrators and the like include discrete capacitive elements. It is frequently desirable, for example in adapting such circuits for use in integrated form, to provide circuits which do not require discrete capacitive elements.

Objects of the invention are therefore to provide new and useful semiconductor circuits which do not require discrete capacitive elements and which are capable of operating as oscillators or as combined oscillators and triggered pulse generators by utilizing the charging and discharging of an internal capacitance of a semiconductor device included in the circuit.

In accordance with the invention, there is provided an oscillatory signal generating circuit which utilizes the charge storage capability of an internal semiconductor capacitance and which does not require external discrete capacitors. The circuit includes an active semiconductor device having first, second and third terminals, and an internal capacitance between the first and second terminals. The device further includes unidirectional means for coupling a supplied pulse type control signal to the first terminal of the device for changing the charge on the capacitance from a first predetermined value to a second predetermined value upon the occurrence of the pulse-type signal and for causing charge to flow through the third terminal upon the termination of the pulse-type signal thereby to change the charge on the capacitance to a third predetermined value in a selected time interval. The circuit additionally includes impedance means coupled between the third terminal and a reference potential for providing a path for the flow of charge therebetween for developing a waveform related to the charge flow. The circuit also includes shaper means responsive to variations in the waveform for generating an output pulse-type signal and feedback means for supplying the output pulse-type signal to the unidirectional means for causing the oscillatory circuit to be free-running.

BRIEF DESCRIPTION OF THE DRAWINGS

Referring to the drawings.

DESCRIPTION OF THE CIRCUIT OF FIG. 1

Figure 1:
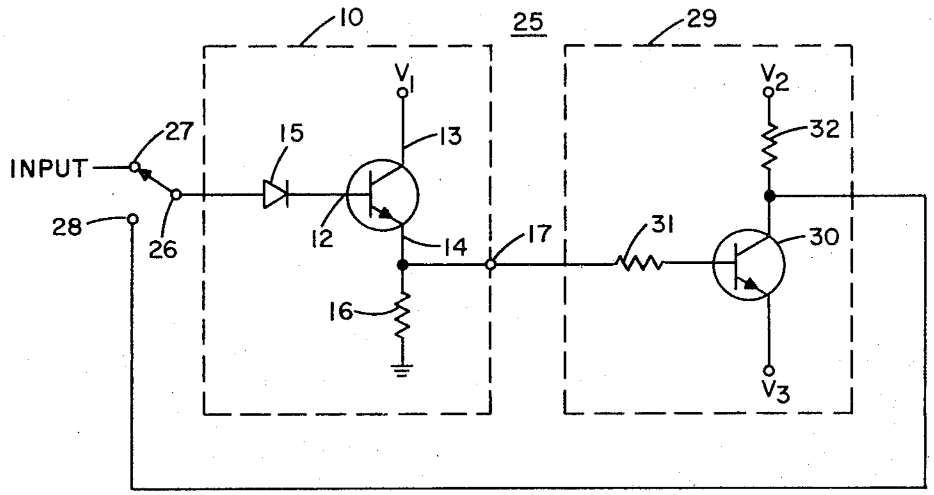
FIG. 1 is a schematic diagram of a combined triggered pulse generator and oscillator circuit which embodies the invention.

FIG. 1 depicts a signal generating circuit 25 which utilizes the charge storage capability of an internal semiconductor capacitance. Circuit 25 can operate either as an externally triggered pulse signal generator or as a free-running oscillatory signal generator, depending upon whether terminal 26 is connected to input terminal 27 or instead connected to feedback terminal 28 via the switch shown.

Signal generating circuit 25 includes circuit 10 which comprises an active semiconductor device, transistor 11, having an internal capacitance between first and second terminals thereof. These terminals are respectively shown as base terminal 12 and collector terminal 13 which is connected to bias voltage $V_1$. Emitter terminal 14 of transistor 11 represents a third terminal.

Circuit 10 further includes unidirectional means shown as diode 15 for coupling a control signal to transistor 11. This control signal comprises a series of pulses and is coupled through diode 15 to base terminal 12 for changing the charge on the internal base-collector capacitance from a first predetermined value, an initially charged state, to a second predetermined value or discharged state. In the subsequent recharging of the internal base-collector capacitance after a variation in the control signal amplitude such as occurs on the termination of a control signal pulse, diode 15 which is now back biased, causes charge to flow through emitter terminal 14 to return the capacitance to the initially charged state. Recharging occurs in a time interval determined by the collector-base gain $\beta$ of transistor 11, the magnitude of the internal base-collector capacitance, and the magnitude of a resistive load.

Circuit 10 also includes impedance means, resistor 16, which comprises the aforementioned resistive load. Resistor 16 is coupled between emitter terminal 14 and a reference potential, shown as ground, for providing a path for the flow of charge through emitter terminal 14 for developing a waveform which is provided at output terminal 17. The amplitude of this waveform is related to the charge flow.

Figure 2:
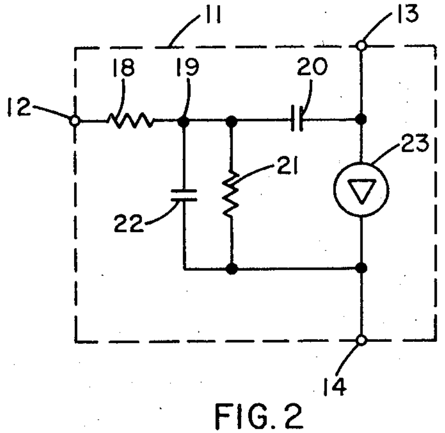
FIG. 2 is a schematic representation of one form of hybrid-pi equivalent circuit for the transistor shown in FIG. 1.

Referring to FIG. 2 there is shown one version of a conventional high frequency hybrid-pi model for transistor 11 of FIG. 1. Briefly stated, this model includes base terminal 12, collector terminal 13 and emitter terminal 14 which correspond to like terminals in FIG. 1. Base resistor 18 is connected between base terminal 12 and intrinsic base 19. Capacitor 20, shown connected between collector terminal 13 and intrinsic base 19, represents the internal capacitance between base terminal 12 and collector terminal 13. In addition, resistor 21 and capacitor 22 are connected in parallel combination between intrinsic base 19 and emitter terminal 14; and current source 23 is connected between collector terminal 13 and emitter terminal 14.

Circuit 25 additionally includes shaper means shown as inverter circuit 29. Inverter 29 includes transistor 30 which saturates when the amplitude of the waveform provided at terminal 17 of circuit 10 varies a predetermined amount in one direction and which cuts off when this amplitude varies a predetermined amount in the other direction. Inverter 29 thus generates an output pulse in response to variations in the waveform provided at terminal 17. The emitter, base and collector of transistor 30 are connected to bias voltage $V_3$, to terminal 17 via resistor 31, and to bias voltage $V_2$ via resistor 32, respectively; and the output pulses are provided at the transistor 30 collector which is connected to terminal 28. In addition, alternate circuits, such as a Schmidt trigger circuit, may be substituted for inverter 29 by those skilled in the art.

In order to operate the circuit of FIG. 1 as an oscillatory signal generator, the previously described output pulse generated by inverter 29 is used as the input control signal. For this purpose, circuit 25 additionally includes feedback means, namely the combination of the lead from the collector of transistor 30 to terminal 26 and the switch shown, for supplying the control signal to the anode of diode 15 for causing circuit 25 to be free running.

OPERATION OF THE CIRCUIT OF FIG. 1

To facilitate describing the operation of circuit 10 of FIG. 1, the equivalent circuit model of FIG. 2 may be substituted for transistor 11. The potential of base terminal 12 is assumed to be initially such that transistor 11 cuts off. The first predetermined value of initial charge on capacitor 20 is represented by the voltage across it, which is substantially equal to the magnitude of bias voltage $V_1$.

A control signal is coupled through diode 15 to base terminal 12. This signal is shown in FIG. 3 as a series of pulses and denoted waveform A, but other signals having appropriate amplitude variations may also be used.

Figure 3:
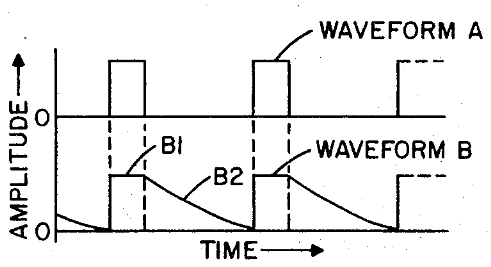
FIG. 3 depicts several waveforms relative to the circuits of FIGS. 1 and 2.

Upon reception of a pulse at base terminal 12, transistor 11 conducts and charge flows through emitter terminal 14 and emitter resistor 16 developing a waveform, such as waveform B in FIG. 3, at output terminal 17. During conduction, the charge across internal capacitor 20 is reduced to a second predetermined value represented by the difference between the magnitude of bias voltage $V_1$ and the magnitude of the voltage pulse supplied to base terminal 12.

Assume transistor 11 to now be in the active region. The instantaneous amplitude of the voltage developed at emitter 14 is provided at output terminal 17 and corresponds to $B_1$ of waveform B. This voltage is substantially equal to the magnitude of the voltage pulse at base terminal 12 minus the small base-emitter voltage drop of transistor 11. Alternatively, if transistor 11 were saturated, the voltage provided at output terminal 17 corresponding to $B_1$ of waveform B would have an amplitude approximately equal to that of bias voltage $V_1$. In this latter instance, for the protection of diode 15, a resistance could be connected in series therewith.

The charge on internal capacitor 20 and thus the amplitude of the voltage waveform provided at output terminal 17, remains constant until termination of the control pulse regardless of whether transistor 11 is saturated or in the active region. After pulse termination, capacitor 20 would ordinarily recharge rapidly to its initial or first predetermined value through the path to ground provided by diode 15. However, diode 15 now becomes back biased, preventing charge from flowing through it in the reverse direction. This causes charge to flow between emitter terminal 14 and intrinsic base 19, so that transistor 11 conducts in the active region. In the active region, source 23 supplies current having a magnitude of approximately $\beta$ times the base current to emitter terminal 14 so that as capacitor 20 recharges to the first predetermined value after termination of a control pulse, the base current multiplied by $(1+\beta)$ flows out emitter terminal 14 through resistor 16 to ground. This recharging is relatively slow in comparison to the prior discharge, and is denoted $B_2$ in waveform B. Since approximately $\beta$ times the base current flows through resistor 16, the effective impedance of resistor 16 may be considered as having been multiplied by the quantity $\beta$ so that the circuit time constant, and thus the time interval required for recharging, is determined by the impedance of resistor 16, the gain $\beta$ of transistor 11, and the magnitude of capacitor 20. If it is desired to additionally lengthen this time interval, known circuit techniques may be employed, such as substitution of a Darlington transistor pair which has an effective gain of $\beta^2$, for single transistor 11.

If, as shown in FIG. 3, the control signal comprises a series of pulses, an alternating or AC type output waveform will be provided at output terminal 17. Upon termination of each control signal pulse, capacitor 20 will recharge until the initial value of charge is restored and transistor 11 cuts off. However, if the pulses are spaced such that the next pulse is received at base terminal 12 before complete recharging occurs, capacitor 20 will quickly discharge again to the second predetermined value upon reception of this next pulse—without transistor 11 ever reaching cutoff. In this latter instance, a somewhat modified waveform will be provided at terminal 17. Similarly, modified waveforms will result if the control pulses are of different amplitudes.

Assuming the pulses are spaced sufficiently apart to permit full recharging, capacitor 20 recharges and the voltage across it increases correspondingly. In addition, transistor construction is usually such that the capacitance of capacitor 20 is not constant, but varies inversely with the voltage across it. As the voltage increases, the capacitance in fact decreases to advantageously provide a more linear charging rate. Thus, segment $B_2$ of waveform B is more linear than if the magnitude of capacitor 20 remained constant.

A signal such as waveform B of FIG. 3, is developed at terminal 17 and supplied to inverter 29 which develops shaped output pulses having a desired width. These pulses are developed at the collector of transistor 30 and supplied to terminal 28 of the switch shown.

More particularly, assume transistor 30 is initially cut off, indicating that the waveform provided at output terminal 17 is of approximately zero amplitude. As shown in FIG. 3, upon reception of a control pulse at the base of transistor 11, the signal amplitude at terminal 17 quickly rises, causing transistor 30 to become saturated. After termination of the pulse, the signal amplitude at the base of transistor 30 decreases until a predetermined value is reached and transistor 30 is cut off. This value may be varied, for example, by appropriate variations of the bias voltages or the magnitudes of the resistors, to alter the pulse width. Inverter 29 inherently provides a delay due to the finite switching time of transistor 30. Therefore, if the signal provided at terminal 28 is fed back via terminal 26 of the switch shown to the anode of diode 15, circuit 25 functions as a free-running oscillator. Otherwise, if the switch in this feedback path is opened, the circuit functions as a triggered pulse generator.

Circuit 25 is thus capable of functioning as an oscillator and a triggered pulse generator under the control of the switch in the feedback path, except that circuit 25 requires no discrete capacitive elements.

While there has been described what is at present considered to be the preferred embodiment of this invention, it will be obvious to those skilled in the art that various changes and modifications may be made therein without departing from the invention.

What is claimed is:

1. An oscillatory signal generating circuit which utilizes the charge storage capability of an internal semiconductor capacitance and which does not require external discrete capacitors, comprising:
   - an active semiconductor device having first, second and third terminals, and an internal capacitance between said first and second terminals;
   - unidirectional means for coupling a supplied pulse-type control signal to the first terminal of said device for changing the charge on said capacitance from a first predetermined value to a second predetermined value upon the occurrence of said pulse-type control signal and for causing charge to flow through said third terminal upon the termination of said pulse-type control signal thereby to change the charge on said capacitance to a third predetermined valve in a selected time interval;
   - impedance means, coupled between said third terminal and a reference potential, for providing a path for the flow of charge therebetween for developing a waveform the amplitude of which is proportional to said charge flow;
   - shaper means responsive to variations in the amplitude of said waveform for generating an output pulse-type signal;
   - and feedback means for supplying said output pulse-type signal to said unidirectional means thereby causing the signal generating circuit to function as a free-running oscillator.

2. A signal generating circuit in accordance with claim 1 wherein said feedback means includes a normally closed switch for coupling said output pulse-type signal to said unidirectional means thereby causing said signal generating circuit to function as a free-running oscillator, and when said switch is opened, for preventing such coupling of said output pulse-type signal, thereby causing said signal generating circuit to function as a triggered pulse generator.

3. A signal generating circuit in accordance with claim 1, wherein said active semiconductor device is a transistor having base, collector and emitter terminals which comprise first, second and third terminals respectively, and wherein said unidirectional means comprises a diode coupled between said feedback means and the base terminal of said transistor for causing charge to flow through said emitter terminal and said impedance means upon the termination of said pulse-type control signal, thereby to change the charge on said capacitance to said third predetermined value in a selected time interval determined by the gain of said transistor the magnitude of said internal capacitance and the magnitude of the impedance of said impedance means.

4. A signal generating circuit in accordance with claim 3 wherein said impedance means comprises a resistor connected between the emitter terminal of said transistor and a source of reference potential.

5. An oscillatory signal generating circuit which utilizes the charge storage capability of an internal transistor capacitance and which does not require external discrete capacitors, comprising:

a transistor having base, collector and emitter terminals and an internal capacitance between said base and collector terminals;

a diode for coupling a supplied pulse-type control signal to said base terminal for changing the charge on said capacitance from a first predetermined value to a second predetermined value upon the occurrence of said pulse-type control signal and for causing charge to flow through said emitter terminal upon the termination of said pulse-type control signal, thereby to change the charge on said capacitance to a third predetermined value in a selected time interval determined by the gain of said transistor, the magnitude of said internal capacitance and the magnitude of a resistive load;

a resistor, comprising said resistive load, coupled between said emitter terminal and a source of reference potential for providing a path for the flow of charge therebetween for developing a waveform the amplitude of which is proportional to said charge flow;

shaper means responsive to variations in the amplitude of said waveform for generating an output pulse-type signal;

and feedback means for supplying said output pulse-type signal to said diode thereby causing the signal generating circuit to function as a free-running oscillator.

6. A signal generating circuit in accordance with claim 5 wherein said feedback means includes a normally closed switch for coupling said output pulse-type signal to said unidirectional means thereby causing said signal generating circuit to function as a free-running oscillator, and when said switch is opened, for preventing such coupling of said output pulse-type signal, thereby causing said signal generating circuit to function as a triggered pulse generator.

* * * * *